United States Patent [19]

Young et al.

[11] Patent Number: 4,818,901

[45] Date of Patent: Apr. 4, 1989

[54] CONTROLLED SWITCHING CMOS OUTPUT BUFFER

[75] Inventors: William R. Young, Palm Bay; Harold D. Davidson, Melbourne, both of Fla.

[73] Assignee: Harris Corporation, Melbourne, Fla.

[21] Appl. No.: 75,641

[22] Filed: Jul. 20, 1987

[51] Int. Cl.$^4$ ............... H03K 19/003; H03K 19/017; H03K 19/094; H03K 17/13

[52] U.S. Cl. .................... 307/451; 307/443; 307/263; 307/585; 307/546; 323/315; 330/288

[58] Field of Search ............... 307/270, 451, 452, 453, 307/446, 570, 443, 542, 546–548, 567, 568, 296.1, 473, 585, 263; 323/315, 316; 330/257, 288

[56] References Cited

U.S. PATENT DOCUMENTS

| | | | |
|---|---|---|---|
| 4,450,371 | 5/1984 | Bismarck | 307/475 |
| 4,485,351 | 11/1984 | Schemmel et al. | 330/288 |
| 4,533,845 | 8/1985 | Bynum et al. | 307/546 X |
| 4,536,662 | 8/1985 | Fujii | 330/288 X |
| 4,567,378 | 1/1986 | Raver | 307/263 X |
| 4,571,511 | 2/1986 | Dischert et al. | 307/547 |
| 4,612,466 | 9/1986 | Stewart | 307/451 X |
| 4,622,482 | 11/1986 | Ganger | 307/263 X |
| 4,634,894 | 1/1987 | Shu et al. | 307/548 X |
| 4,638,187 | 1/1987 | Boler et al. | 307/451 |
| 4,717,869 | 1/1988 | Koch et al. | 330/288 X |

Primary Examiner—Stanley D. Miller
Assistant Examiner—David R. Bertelson
Attorney, Agent, or Firm—Barnes & Thornburg

[57] ABSTRACT

An output buffer initially operating its output transistors in a constant current mode in response to an input signal transition and subsequently operating its output transistors in a constant voltage drive mode as the output approaches the desried output level. The control electrode of the output transistor is controlled by a switchable voltage divider or current mirror. The control of an output transistor may not be activated until the other output transistor is turned off to prevent having both output devices on at the same time.

28 Claims, 5 Drawing Sheets

CONTROLLED SWITCHING CMOS OUTPUT BUFFER

BACKGROUND AND SUMMARY OF THE INVENTION

The present invention relates generally to buffers and more specifically to an improved CMOS output buffer.

CMOS buffers generally include a pair of complementary MOS transistors having a conduction path connected in series between a pair of power terminals and the output being at the junction of the two transistors. The output transistors act as a current source or sink and must drive a generally capacitive load. Using this structure, the current available during switching typically is continuously changing. The maximum current occurs when the device is in its saturated region, once in the linear range the control current decreases as the voltage across the output device decreases. This change in output current requires a higher peak current than if the device delivered a constant current for the same switching time.

An effort to increase the speed of switching while dissipating less power and providing symmetrical rise and falls has been addressed in level shifting circuits as illustrated in U.S. Pat. No. 4,450,371 to Bismarck. A large device capable of carrying a lot of current is switched on at the beginning of the transition to quickly supply current to the output and is then switched off as the output approaches the appropriate output level. These devices are in parallel with smaller high-ON-impedance load devices.

One method of stabilizing the maximum output current that we initially derived is to convert the simple output inverter structure into switched current sources as illustrated in FIG. 1. Transistors Q1 and Q3 and transistors Q2 and Q4 form current mirrors with the output devices Q1 and Q2 being the output leg of the current mirrors. The problem with the current source approach of FIG. 1 is that as the output voltage VO approaches either of the power terminals V+ or ground, the power in the output transistors Q1 and Q2 approach zero. However, an internal DC power still occurs.

The object of the present invention is to operate the output transistor at a controlled current capacity during switching without an accompanying power dissipation at steady state.

This and other objects of the invention are attained by controlling the output transistor of the buffer to operate in a constant current mode in response to an input signal transition of the buffer and subsequently operating the output transistor in a constant voltage mode when the output signal approaches the desired output level. The output transistor is controlled by limiting the voltage applied to its gate until the output signal approaches a desired output voltage, then the maximum supply voltage is applied to the gate. The voltage limiting can be provided by either a voltage divider or using the output transistor as the output leg of a current mirror which is activated by the input signal transition to drive the output transistor in a constant current mode and deactivated by the output signal approaching the desired output level.

The voltage divider limits the gate-to-source voltage and thereby drives the output transistor in a saturated mode. Once the output reaches a desired level, the voltage divider is disabled and a constant voltage is applied to the gate to drive the output transistor in its linear region. The voltage divider may include a resistor and series connected switch responsive to input signal to activate the voltage divider and a second resistance/switch which is controlled by the output signal to perform the activation and deactivation of the voltage divider.

In the current mirror embodiment a switchable current source is responsive to the input signal transition to provide an input current to the current mirror and includes a series switch in the input leg to disconnect the input leg from a power terminal to disrupt the current source and drive the output transistor with a constant voltage.

In response to an opposite input signal transition, the two ends of the voltage divider or the input leg of the current mirror are connected to the same power terminals to prevent drive of the output transistor. An additional switching element may be provided directly to the control gate of the output transistor and being responsive to the input signal to quickly turn the output transistor off.

The buffer may have a complementary pair of output devices each being responsive to an opposite transition so as to be operated in a constant current mode during the initial stage and in a constant voltage mode as the output approaches a desired output level. Interconnecting logic may be provided to prevent activation of one of the output transistors until the other has been turned off. Input latches and tri-state control may also be provided as part of the input logic.

Other objects, advantages and novel features of the present invention will become apparent from the following detailed description of the invention when considered in conjunction with the accompanying drawings.

DETAILED DESCRIPTION OF THE DRAWINGS

An output of a buffer is sized to sink or source a specified current at a given drain-to-source voltage with a minimum supply voltage. The devices of the present invention are designed such that the desired current is in the saturation range of the output transistor. An insulated gate field effect transistor is in saturation when the drain-to-source voltage is equal to or greater than the gate-to-source voltage minus the threshold voltage of the device. The present invention drives the output transistor into saturation very quickly by controlling the gate-to-source voltage of the output transistor and thereby maintains the drain-to-source current constant. After the desired drain-to-source voltage is reached, the gate of the output device is driven to the maximum supply voltage.

In all of the embodiments to be discussed, transistors and gates having the same function will have the same reference number for sake of clarify and brevity.

Figure 1:
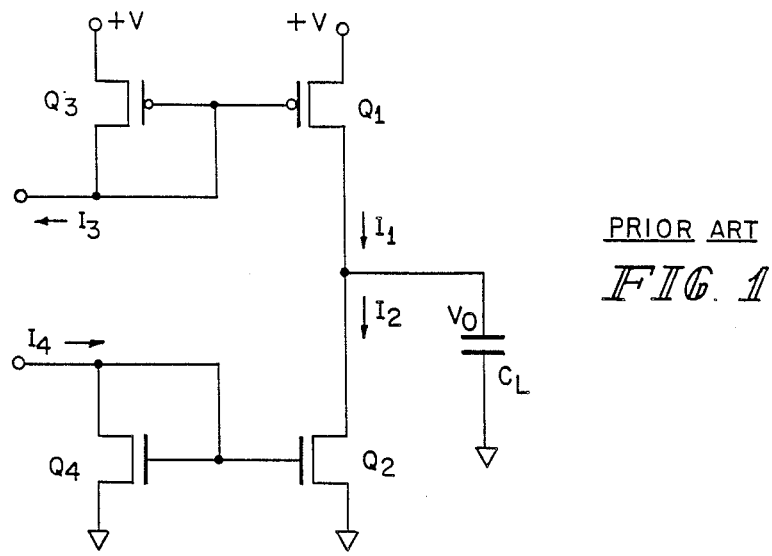
FIG. 1 is a schematic of a switched current source buffer.
Figure 2:
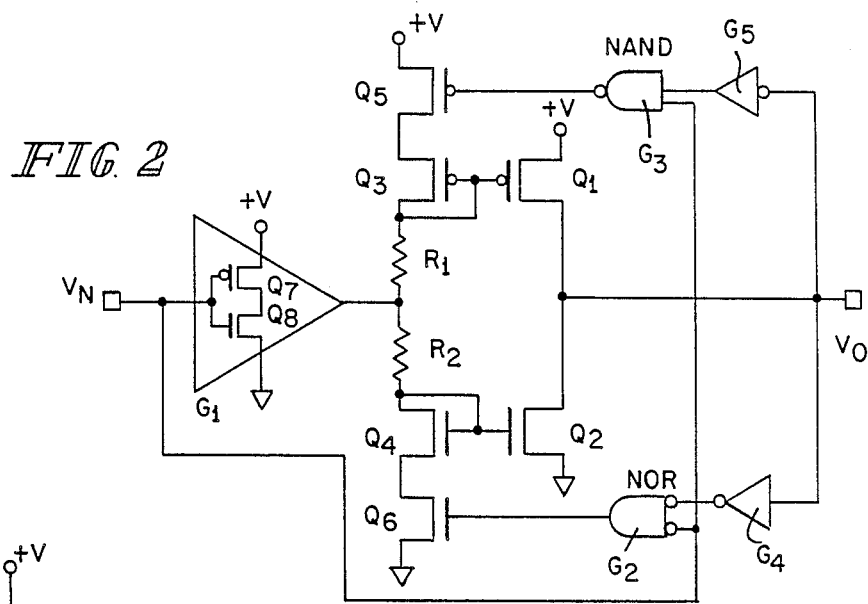
FIG. 2 is a schematic of a current mirror embodiment of a buffer incorporating the principles of the present invention.

In a first current mirror embodiment illustrated in FIG. 2, the input voltage VN is connected through an inverter G1 which includes complementary insulated gate field effect transistors Q8 and Q7 to one of a pair of resistors R1 and R2. A first current mirror includes an input leg having R1, Q3 and Q5 and an output leg including the output transistor Q1 and a second current mirror includes resistor R2, transistors Q4 and Q6 and an output leg including output resistor Q2. The output VO is taken from the drains of Q1 and Q2. The control of transistors Q5 and Q6 is by logic including inverters G5, G4 and NAND-and NOR-gate G3 and G2 connected respectively to the gates of transistors Q5 and Q6. The inputs to G4 and G5 are connected to the output V0. The inputs to G2 are the input VN and the output of G4 and the inputs to G3 are the input VN and the output of G5.

To understand the operation of FIG. 2, we will assume that the input and output voltage VN and V0 equal the power source voltage V+ or a high. Transistor Q8 of the inverter G1 is on providing ground or a low at the common terminals of resistors R1 and R2. With the output V0 high, the outputs of G5 and G4 are both low. The output of logic gate G2 is low because input VN is high and the output of G3 is high because the output of G5 is low, thereby maintaining transistors Q5 and Q6 off. This disables the respective current mirror inputs and prevents current flow therein such that the low of Q8 provided at the output of the inverter G1 is applied to the gates of output transistors Q1 and Q2 maintaining Q2 off and Q1 on. Thus the output V0 is maintained high by Q1.

When the input VN changes from high to low, Q8 is turned off and Q7 is turned on providing a high at the common terminal of resistors R1 and R2. While V0 is a logic high, the outputs of G4 and G5 are low. With G5 low, G3 maintains a logic high on Q5 keeping it off and thus disables the current mirror. With VN and the output of G4 a logic low, G2 provides a logic high turning Q6 on and enabling the current mirror for Q2. Q5 being off and the high voltage at the intersection of R1 and R2 causes the gate of Q1 to go to V+, thus turning Q1 off. Transistor Q7 being on and resistor R2 provide current to the current mirror consisting of transistors Q4, Q6 and Q2. Thus, Q2 is driven in a constant current mode. As the output voltage V0 reduces to the threshold of the inverter G4, the output of G4 switches to high causing gate G2 to switch to a logic low signal to turn Q6 off. This disrupts the input leg of the current mirror allowing the high voltage from Q7 to be applied to the gate Q2 to drive it in a constant voltage mode. This turns on Q2 fully.

In order for Q4, Q6 and Q2 to act as a current mirror, the on resistance RON of Q6 must be much less than the on resistance of Q4, and Q2 and Q4 must both be operating in their saturated regions. Saturation occurs when an MOS transistor drain-to-source voltage is greater than or equal to its gate-to-source voltage minus its threshold voltage, i.e., $V_{DS} \geq V_{GS} - V_T$. For the current to be determined by R2, the on resistance of Q7 must be much less than the resistance of R2 and the resistance of R2 must be much greater than the on resistance of Q4.

For the transition from VN and V0 being equal to a low signal to VN going high, the inverter transistor Q7 is turned off and Q8 is turned on putting a low voltage signal at the intersection of R1 and R2. With the output V0 being low, the outputs of G4 and G5 are high. The output of G4 being high causes G2 to produce a low output signal maintaining Q6 off. The output of G5 being high and VN going high cause NAND G3 output to be low, turning on Q5. Transistor Q8 and resistor R1 supply the input current for the current mirror formed by Q3, Q5 and output transistor Q1, driving it in a constant current mode. When the output voltage V0 rises sufficiently above the inverter threshold of G5, the output of G5 goes low and NAND-gate G3 goes high turning off Q5. This interrupts the input leg of the current mirror Q5, Q3 and Q1 and causes the substantially ground input from Q8 to be applied to the gate of Q1 to drive it in a constant voltage mode. When the output voltage of V0 is sufficiently above the inverter threshold of G4, its output goes low but NOR-gate G2 stays low because VN is high to maintain Q6 off.

Figure 3:
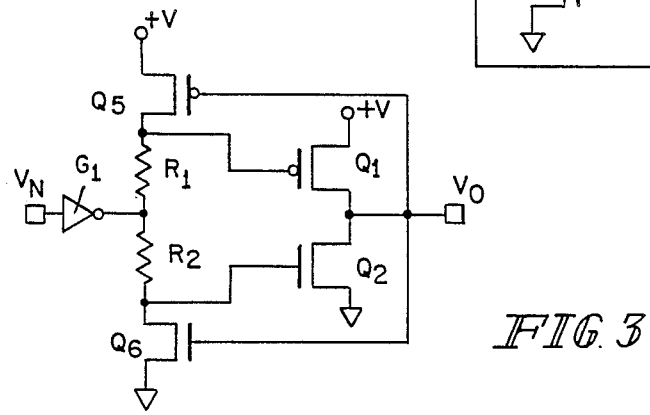
FIG. 3 is a schematic of a voltage divider embodiment of a buffer incorporating the principles of the present invention.

An example of an application of the present invention to a voltage divider instead of a current mirror output drive method is illustrated in FIG. 3. A voltage divider including R1 and transistor Q5 for output transistor Q1 and a voltage divider R2 and Q6 form a voltage divider for output transistor Q2. The voltage divider is activated by the input signal VN through an appropriate transistor of inverter G1 to apply a high or low logic voltage signals to R1 and R2 with the appropriate second leg of the divider Q5 or Q6 being on depending upon the output voltage V0. The transistors Q5 and Q6 maintain a low gate-to-source voltage of the output transistors Q1 and Q2 to maintain it in saturation and operate in the constant current mode. As the output voltage approaches the desired voltage, transistors Q5 and Q6 change states deactivating the voltage divider for the appropriate output transistor Q1 or Q2 and allowing the output voltage from inverter G1 to be applied directly to the output transistors Q1 and Q2 and to operate it in a constant voltage mode.

Assuming that the input and output signals VN and V0 are both high, the output of G1 is low, Q1 and Q6 are on and Q2 and Q5 are off. When the input VN changes from a high to a low, the output of G1 becomes high turning Q1 off and forming a voltage divider between R2 and Q6. When the output voltage V0 becomes sufficiently low, Q6 is turned off and Q5 is turned on. Since the voltage at both ends of the voltage divider including R1 and Q5 are the same high value, it is inoperative even though Q5 is on and the gate of Q1 is pulled high to maintain it off. For a low to high input transition Q1 is controlled by its voltage divider R1 and Q5 to operate first in a constant current and then in a constant voltage mode.

Figure 4:
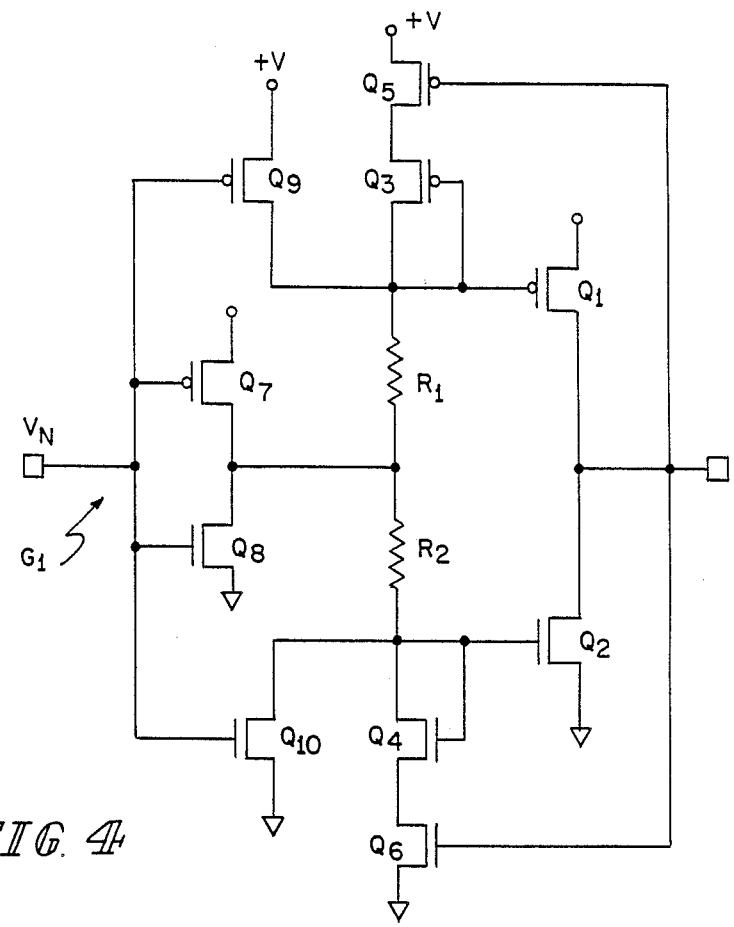
FIG. 4 is a schematic of another embodiment of a current mirror of a buffer with quick turn-off incorporating the principles of the present invention.

In certain situations, it is desirable to prevent any throughput current flowing simultaneously between Q1 and Q2 by assuring that the previously on output transistor is turned off before the previously off transistor is turned on. A modification to the buffer of FIG. 2 is illustrated in FIG. 4 and includes quick off transistors Q9 and Q10 having their gates connected to the input VN and their respective drains connected to the gates of the output transistors Q1 and Q2 respectively. Assume that VN and V0 are both high. Thus, Q1, Q6, Q8 and Q10 are on, and Q2, Q3, Q4, Q5, Q7 and Q9 are off. With Q8 and Q10 both being on, there is no voltage drop across the resistor R2. As the input VN is changed from a high to a low, Q8 and Q10 turn off and Q7 and Q9 turn on. Q9 provides a high signal to the gate of Q1 and Q7 provides a high signal to the common connection of R1 and R2. Q9 by pulling the gate of Q1 quickly to V+ turns Q1 quickly off. In the embodiment of FIG. 2, the voltage on the gate of Q1 would be pulled up to Q7 through the resistor R1 and thus have a short time delay. Q7 being on and pulling up the gate of Q2 to turn it on is delayed by the resistor R2. Thus Q1 is turned off before Q2 is turned on minimizing any flow between Q1 and Q2. Q10 will operate in the same manner for a low to high transition to turn Q2 off before Q1 turns on.

Figure 5:
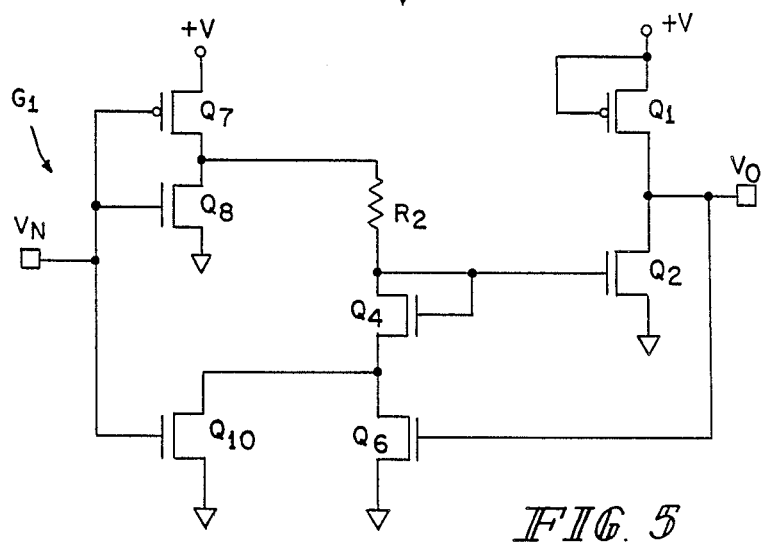
FIG. 5 is a schematic of a current mirror embodiment with quick turn-off for a single polarity buffer incorporating the principles of the present invention.

The application of the present principle to a single polarity or single sided buffer is illustrated in FIG. 5. The complementary output transistor Q1 is connected to provide an additional electrostatic discharge protection element to the output V0 having its conduction path in parallel with conduction path of output transistor Q2. As a further distinction from FIG. 4, the quick off transistor Q10 is connected between the source of Q4 of the current mirror and ground and the gate of Q10 is controlled by the input voltage VN. With VN and V0 high, Q6, Q8 and Q10 are on and Q2, Q4 and Q7 are off. For an input transition of VN from high to low, Q8 and Q10 are turned off and Q7 turns on, activating the current mirror through R2 and driving Q2 in a constant current mode. As V0 approaches a low level, Q6 is turned off disrupting the current mirror, allowing the gate of Q2 to rise to V+ through Q7 and R2, thus driving Q2 in a constant voltage mode.

For a VN transition from low to high, Q7 is turned off and Q8 and Q10 are turned on. With Q10 turning on, the source of Q4 is brought low which allows the resistor R2, Q4 and Q10 to act as parallel discharge paths for the capacitance of the gate of Q2 to turn Q2 off with a controlled turn off delay. Since the turn on time of Q2 is a function of Q4, Q6, and R2, Q7 and the turn off time is a function of Q4, Q10 and R2, Q8, separate turn on and turn off times may be provided for Q2.

Figure 6:
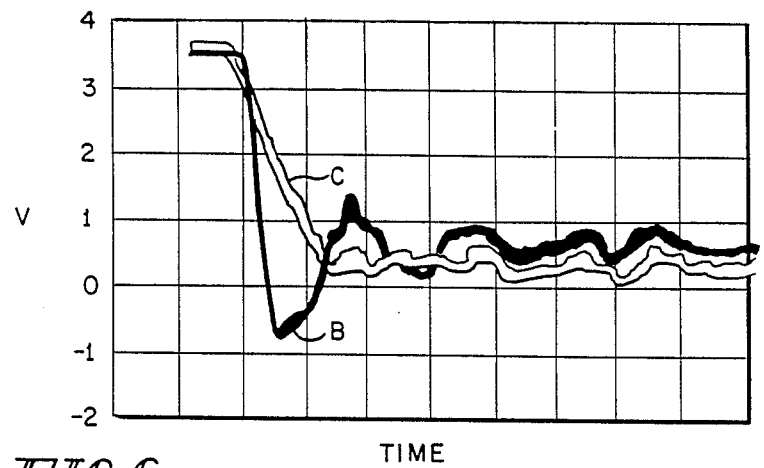
FIG. 6 is a graph of the output signal comparing a bipolar buffer to a CMOS buffer equivalent to that in FIG. 5.

A curve of the output voltage V0 for the buffer of FIG. 5 is illustrated in FIG. 6 as Curve C. A prior art bipolar buffer output response is illustrated as Curve B. It is noted that although the bipolar responds more quickly and initially lowers the output voltage, there is substantial hunting or ringing before it settles to a final level. The output voltage produced by the buffer of FIG. 5 reaches a more stable output voltage substantially quicker.

One of the sources of ringing is the reflection of the change of voltage with respect to time or dv/dt. In the bipolar circuit of curve B, the device is driven hard with a high change of voltage in a very short period of time. This produces large reflections resulting in the curve B going below the desired final value and hunting. In the present invention, the output devices are operated as constant current sources having a constant dv/dt. This linear, constant change of voltage with respect to time results from maintaining the output transistor in saturation or its constant current mode as long as possible. When the transistor is in its constant current mode, the change of the output voltage with respect to time is a function of the capacitance of the output and current from the current source.

In order to maintain the output device in its constant current mode as long as possible, the output transistors Q1 and Q2 are selected to be substantially larger devices than transistors selected to be driven by the maximum supply voltage available. These larger devices are maintained in saturation by low gate voltage. The gate voltage and device size are selected to provide the desired current level to achieve switching in the desired time. By using a low gate voltage, the device stays in saturation longer since the output voltage must be substantially closer to the desired output voltage before it switches from its constant current to its constant voltage mode.

Figure 7:
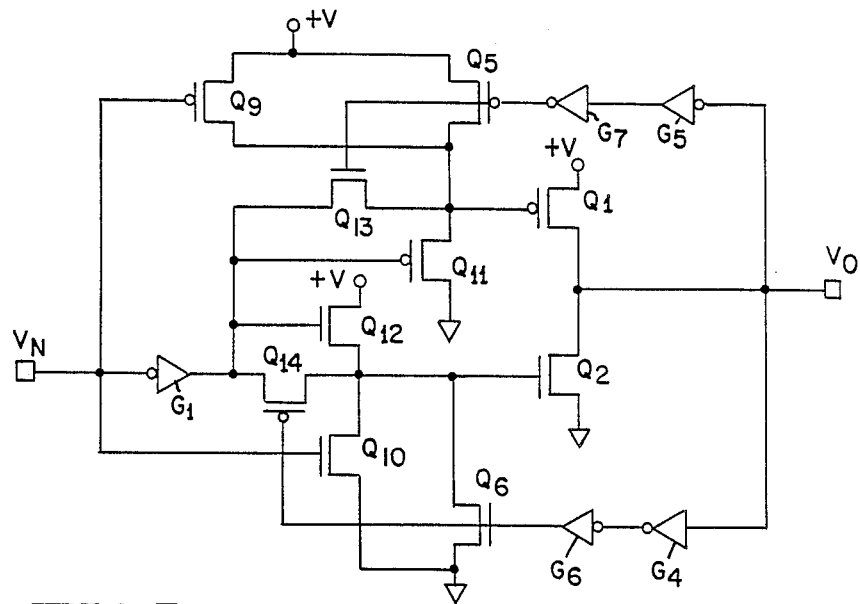
FIG. 7 is a schematic of another embodiment of a voltage divider buffer with quick turn-off according to the principles of the present invention.

Another design incorporating the voltage divider concept is illustrated in FIG. 7. The resistors R1 and R2 are replaced by transistors Q11 and Q12 respectively. These transistors are controlled by the output of the inverter G1. The other leg of the voltage divider including transistors Q5 and Q6 are controlled by the output through inverters G5, G7 and G4, G6 respectively. The thresholds of the inverters determine the output voltage at which Q5 and Q6 are deactivated. The gates of quick turn off transistors Q9 and Q10 controlled by the input VN and their drains are connected to the gates of the output transistors Q1 and Q2 and their sources are connected to V+ and ground respectively. Transmission gate transistors Q13 and Q14 connect the output of the inverter G1 to the gates of output transistors Q1 and Q2 respectively.

With the input VN and output V0 both being high, the output of inverters G1, G4 and G5 are low and G6 and G7 are high, transistors Q1, Q6, Q10 and Q13 are on and Q2, Q5, Q9, Q11, Q12 and Q14 are off. On an input transition from high to low, Q9 is turned on to quickly pull up the gate of Q1 and turn it off. The output of G1 goes high turning Q12 on to form a voltage divider with on Q6 and drive Q2 in a constant current mode. Q14 is off. As the output voltage V0 decreases and switches G4 and G6, Q6 off disrupting the voltage divider with Q12, G6 going low also turns Q14 on and the high output of inverter G1 is then applied directly to the gate of Q2 through turned on Q14 to drive it in a constant voltage mode. As the voltage on the gate of Q2 rises to +V, Q12 is switched off by the reduction of its gate-to-source voltage.

The operation is similar for circuitry to turn Q1 on and Q2 off for an opposite transition of the input from low to high. By substituting transistors Q11 and Q12 for resistors R1 and R2, the need to provide resistors is eliminated. The quick turn off of Q1 and Q2 prevent a simultaneous activation and throughput current.

Figure 8:
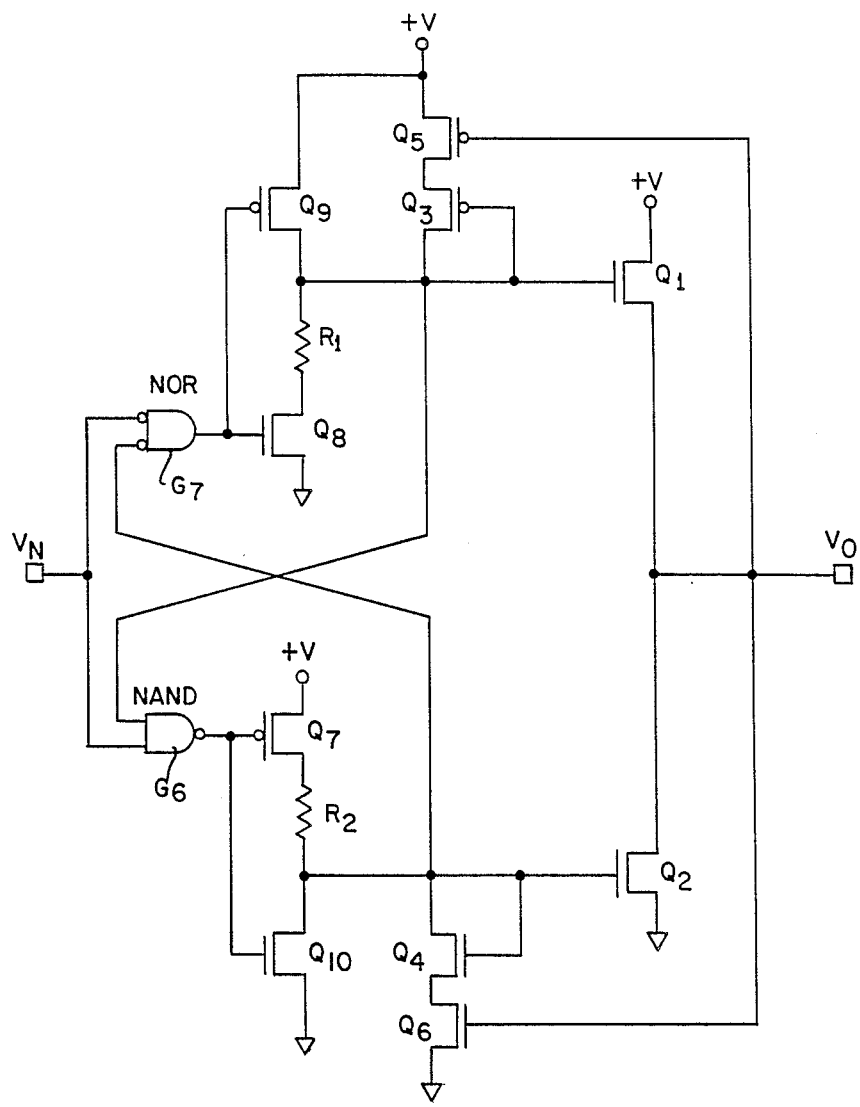
FIG. 8 is a schematic of another current mirror embodiment with quick turn-off and delayed turn-on actuation according to the principles of the present invention.

To completely eliminate any possibility that one of the output transistors turns on before the other is turned off, the circuit of FIG. 8 is provided. NAND-gate G6 is connected between the input VN and inverter transistor Q7 and quick off transistor Q10 and monitors the voltage on the gate of Q1. Similarly a NOR-gate G7 is connected between the input VN and the inverter transistor Q8 and the quick off transistor Q9 and monitors the voltage at the gate of output transistor Q2. It should be noted that the buffer of FIG. 8 is an inverting buffer such that for stable condition of VN being high and V0 being low, the gates of Q1 and Q2 are high such that Q1 is off and Q2 is on. With V0 low, Q5 is on and Q6 is off. Both inputs to NAND-gate G6 are high and the VN input to NOR-gate G7 is high and thus their outputs are both low. Thus Q7 is on and Q10 is off providing the high voltage on the gate of Q2, and Q8 is off and Q9 is on providing the high voltage on the gate of Q1.

With an input VN changing from high to low, the output of NAND-gate G6 changes to a high turning Q7 off and activating Q10 to immediately draw the gate of Q2 to a low and turning it off. The drop of the voltage at the gate of Q2 and the low on VN changes the inputs to NOR-gate G7 to both being low, changing its output from a logic low to a logic high. This turns off transistor Q9 and turns on transistor Q8 activating the input leg of the current mirror driving Q1 in a constant current mode. As the output V0 changes to a high, Q5 is turned off allowing the logic low voltage from Q8 to be provided to the gate Q1 and drive it in a constant voltage mode. As can be seen, the NOR-gate G7 did not change its output in response to a change in the input signal VN and waited until the gate signal for Q2 was sufficiently low to turn it off before activating the circuit which turns Q1 on.

The operation of the NAND-gate G6 is similar in that for the input transition from a low to a high the NAND-gate G6 will still maintain a high output until the gate of Q1 also goes from a low to a high turning Q1 off. At this point G6 will provide a low output turning off Q10 and turning on Q7 activating the input to the current mirror to drive Q2 in a constant current mode.

It should be noted that the inverting buffer of FIG. 8 requires two gate delays, namely G7 and Q9 or G6 and Q10 to turn off the previously on transistor Q1 or Q2 respectively and an additional two gate delays, namely G7 and Q8 or G6 and Q7 to turn on the previously off transistor Q1 and Q2 respectively. In some applications a four gate delay for turning an element on is not desirable.

Figure 9:
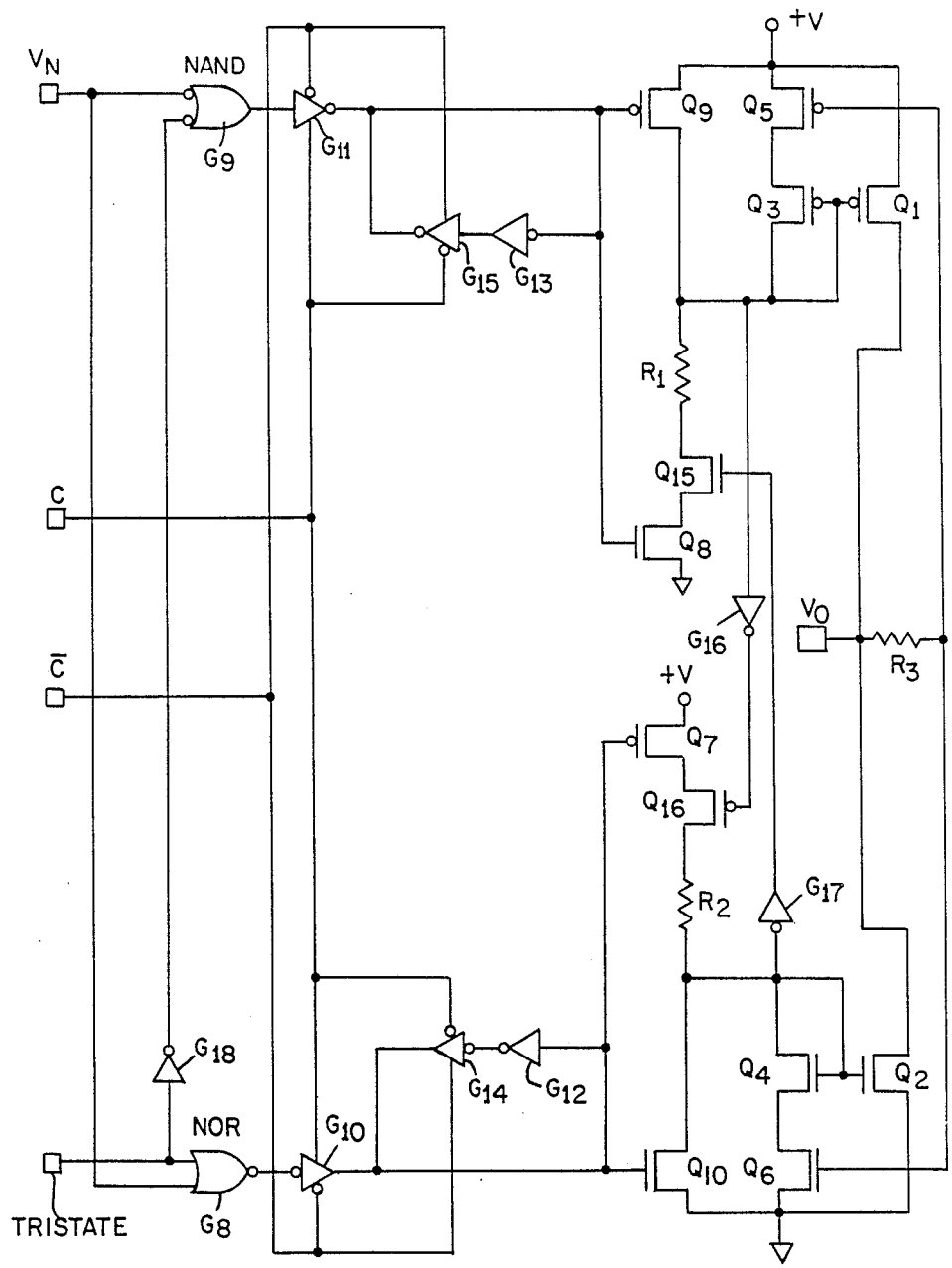
FIG. 9 is another embodiment of a current mirror with quick turn-off, delayed turn on actuation, input latches and tri-stating buffer according to the principles of the present invention.

FIG. 9 shows a buffer which can be adapted to have one gate delay to turn off a device and two gate delays to turn on a previously off device after the first device has been turned off. With respect to FIG. 9, the delays were measured from the output of the latch and do not include the additional delays of the input latches and tri-stating logic to be discussed. The input signal VN is provided as one input to a NAND-gate G9 and a NOR-gate G8 with the second input being a Tristate signal directly to G8 and through inverter G18 to a NAND-gate G9. Connected to the output of the NAND-gate G9 is a latch including tri-state inverters G11 and G15 and inverter G13. Connected to the output of the NOR-gate G8 is a latch including tri-state inverters G10 and G14 and inverter G12. Clock signal C and its inverse signal C̄ are provided to the latches.

The NOR-gate G8 will provide a low output signal for all combinations of the input VN and Tristate except when they are both low. When G10 is enabled by C, the high output signal of G10 activates quick turn off transistor Q10 to ground the gate of output transistor Q2 and turn it off and turn off transistor Q7 which is in the conduction path of the resistor R2 of the input leg of the current mirror. NAND-gate G9 will provide a high output signal for all combinations of input except for the Tristate being low and VN being high. When tri-state inverter G11 is activated, the low output signal of G11 actuates a quick turn off transistor Q9 and turns off Q8 disrupting the path for resistor R1 of the input leg of the current mirror thereby turning Q1 off.

For the initial operation assume the Tristate is low, VN and the output V0 are both high. The latches should also be in their unlatched condition, namely C being high and C̄ being low. For this condition, the outputs of G8 and G9 are low and the outputs of G10 and G11 are high, thus turning transistors Q8 and Q10 on and Q7 and Q9 off. V0 being high turns Q6 on and Q5 off. With Q10 on and Q7 off, Q2 and Q4 are off and the output of G17 is high turning Q15 on. Since Q5 and Q9 are off and Q8 and Q15 are on, Q1 is on being driven in its constant voltage drive mode. With the gate of Q1 at ground, the output of G16 is high turning Q16 off.

As the input signal VN changes from high to low, the signal through G9 and G11 becomes low turning on quick turn off Q9 to pull up the gate of Q1 and turn it off. The low output of G11 also turns off Q8 interrupting the input path of the current mirror. Similarly, G8 and G10 provide a low input signal, turning off Q10 and turning on Q7. As the voltage on the gate of output transistor Q1 is being pulled up and exceeds the threshold of inverter G16, Q16 is activated completing the conduction path to the current mirror including Q2 and thereby operating it in a constant current mode.

Inverter G16 and the transistor Q16 enables the current mirror only after the voltage on the input gate to Q1 has been pulled up sufficiently to turn it off. As in the buffer of FIG. 8, this eliminates throughput of current between Q1 and Q2 by making sure that Q2 is not turned on until Q1 is turned off. The same is true using inverter G17 and transistor Q15 for not allowing Q1 to be turned on until Q2 is turned off.

As the output V0 decreases, the voltage to the gate of transistor Q6 decreases in a delayed fashion by time constant determined by the resistor R3 times the sum of the capacitance of the transistors Q5 and Q6. As the on-resistance of Q6 approaches the on-resistance of Q4, the voltage on the gates of Q2 and Q4 will rise turning the output transistor Q2 on harder. The resulting positive feedback will rapidly turn Q6 off and the voltage on the gate of Q2 will rise to V+, switching Q2 from a constant current mode to a constant voltage mode. The addition of resistor R3 allows the transistors Q5 and Q6 to be of smaller geometry by slowing the rate at which their respective gate voltages change. R3 also isolates the capacitance of the gates of Q5 and Q6 from the circuit output V0. If additional delay is required to prevent one of the output transistors Q1, Q2 from being turned on before the other is turned off, then the inverters G16 and G17 can receive their inputs from the other terminal of resistors R1 and R2 to add more resistance and therefore time delay to the path.

With C high and C̄ low, both latch G11, G13 and G15 and G10, G12 and G14 are open and data at their inputs, the output of G9 and G8 respectively, are inverted by G11 and G10 and flow to the gates of Q8 and Q9 and Q7 and Q10 respectively. Tristate inverters G15 and G14 are deactivated when the latches are open. When C is low and C̄ is high the latches are closed and retain their final open state. When the latches are closed G11 and G10 are deactivated, G15 and G14 are enabled to maintain the state of the latches.

It should be noted that if latches are not required, the output of NOR-gate G8 would be connected directly to the gates of Q8 and Q9 and the output of NAND-gate G9 would be connected directly to the gates of transistors Q7 and Q10. Similarly if the tri-state is not required, the input VN would be connected directly to the gates of Q8, Q9, Q7 and Q10.

Although FIG. 5 illustrates one of the circuits as a single polarity buffer, other of the circuits may also be built as a single polarity buffer. Also, FIG. 8 illustrates the buffer as an inverting buffer and the other buffers may also be inverting buffers with appropriate changes.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A buffer comprising:
    buffer input and output;
    an output transistor having a conduction path connected between said buffer output and a first power terminal and having a control electrode, and
    control means connected to said buffer input and output and said control electrode for operating said output transistor in a constant current mode in response to a first level input signal on said buffer input and a first level output signal on said buffer output and operating said output transistor in a constant voltage mode in response to said first level input signal and a second level output signal.

2. A buffer according to claim 1 wherein said control means includes a voltage divider means connected to said control electrode, said buffer input and output, activated by said first level input and output signals for operating said output transistor in a constant current mode, and deactivated by said first level input signal and said second level output signal for operating said output transistor in said constant voltage mode.

3. A buffer according to claim 2 wherein said voltage divider means includes a first resistive means connected between a second power terminal and said control electrode and activated by said first level input and output signals, and a second resistive means connected between said first power terminal and said control electrode and deactivated by said second level output signal.

4. A buffer according to claim 3 wherein said first resistive means includes a resistor and series connect switch responsive to said input signal and said second resistive means includes a transistor responsive to said output signal.

5. A buffer according to claim 3 wherein said first and second resistive means each include a transistor responsive to said input and output signals respectively as resistive elements.

6. A buffer according to claim 3 wherein said first resistive means includes means for connecting said first resistive means to said first power terminal and disconnecting said first resistive means from said second power terminal in response to a second level input signal to deactivate said voltage divider means and turn off said output transistor.

7. A buffer according to claim 6 including switch means connected to said control electrode for turning off said output transistor in response to said second level input signal.

8. A buffer according to claim 1 including switch means connected to said control electrode for turning off said output transistor in response to a second level input signal.

9. A buffer according to claim 1 wherein said control means includes a current mirror means having an input leg and an output leg mirroring current in said input leg, said output transistor is in said output leg, said input leg being connected between said first power terminal and a second power terminal and activated by said first level input and output signals for operating said output transistor in a constant current mode and deactivated by said second level output signal for operating said output transistor in a constant voltage mode.

10. A buffer according to claim 9 wherein said input leg includes a switchable current source means for providing input current to said input current leg in response to said first level input signal and first switch means for disconnecting said input leg from said first power terminal in response to said second level output signal.

11. A buffer according to claim 10 wherein said switchable current source means includes a second switch means for disconnecting one end of said input leg from said second power terminal and connecting it to said first power terminal in response to a second level input signal to deactivate said current source means and turn off said output transistor, and for connecting said one end of said input leg to said second power terminal in response to said first level input signal to activate said current source means.

12. A buffer according to claim 11 including a third switch means connected to said control electrode for turning off said output transistor in response to said second level input signal.

13. A buffer according to claim 9 including switch means connected to said control electrode for turning off said output transistor in response to a second level input signal.

14. A buffer comprising:
    a buffer input and output;
    first and second output transistors each having a conduction path connected between said buffer output and a respective first and second power terminal respectively and having a control electrode;
    first control means connected to said buffer input and output and said control electrode of said first output transistor for operating said first output transistor in a constant current mode in response to a first level input signal on said buffer input and a first level output signal on said buffer output and operating said first output transistor in a constant voltage mode in response to said first level input signal and a second level output signal; and
    second control means connected between said buffer input and output and said control electrode of said second output transistor for operating said second output transistor in a constant current mode in response to a second level input signal and said second level output signal and operating said second output transistor in a constant voltage mode in response to said second level input signal and said first level output signal.

15. A buffer according to claim 14 wherein:
    said first control means includes first off means for turning off said first output transistor in response to said second level input signal; and
    said second control means includes second off means for turning off said second output transistor in response to said first level input signal.

16. A buffer according to claim 14 wherein:

said first control means includes first enable means for enabling said first control means in response to said first level input signal and after said second output transistor has turned off; and said second control means includes second enable means for enabling said second control means in response to said second level input signal and after said first output transistor has turned off.

17. A buffer according to claim 16 wherein:

said first and second control means each include a resistive means and a first series switch connected between a respective control electrode and said first and second power terminals respectively, said first series switches of said first and second control means are activated by said first level input signal and second level input signals respectively; and said first and second enable means are each a second series switch in series with a respective first series switch and activated by a respective output transistor turning off to enable a respective control means.

18. A buffer according to claim 16 wherein:

said first and second control means each include a resistive means and a first series switch connected between a respective control electrode and said first and second power terminals respectively; and said first and second enable means activates a respective first series switch in response to a respective input level signal and after a respective output transistor turns off.

19. A buffer according to claim 14 including latch means, connected between said buffer input and said first and second control means to latch said input signal.

20. A buffer according to claim 14 wherein:

said first control means includes a first voltage divider means having a first resistive means connected between a second power terminal and said control electrode of said first output transistor and activated by said first level input signal, and a second resistive means connected between said first power terminal and said control electrode of said first output transistor and deactivated by said second level output signal; and said second control means includes a second voltage divider means having a third resistive means connected between a first power terminal and said control electrode of said second output transistor and activated by said second level input signal, and a fourth resistive means connected between said second power terminal and said control electrode of said second output transistor and deactivated by said first level output signal.

21. A buffer according to claim 20 wherein:

said first resistive means includes means for connecting said first resistive means to said first power terminal and disconnecting said first resistive means from said second power terminal in response to said second level input signal to deactivate said first voltage divider means and turn off said output transistor; and said third resistive means includes means for connecting said third resistive means to said second power terminal and disconnecting said third resistive means from said first power terminal in response to said first level input signal to deactivate said second voltage divider means and turn off said second output transistor.

22. A buffer according to claim 14 wherein:

said first control means includes a first current mirror means having an input leg and an output leg mirroring current in said input leg, said first output transistor is in said output leg, said input leg being connected between said first and second power terminal and activated by said first level input signal for operating said first output transistor in a constant current mode and deactivated by said second level output signal for operating said first output transistor in a constant voltage mode; and said second control means includes a second current mirror means having an input leg and an output leg mirroring current in said input leg, said second output transistor is in said output leg, said input leg being connected between said first and second power terminals and activated by said second level input signal for operating said second output transistor in a constant current mode and deactivated by said first level output signal for operating said second output transistor in a constant voltage mode.

23. A buffer according to claim 22 wherein:

said input leg of said first current mirror means includes a first switchable current source means for providing input current to said input current leg in response to said first level input signal and first switch means for disconnecting said input leg from said first power terminal in response to said second level output signal; and said input leg of said second current mirror means includes a second switchable current source means for providing input current to said input current leg in response to said second level input signal and second switch means for disconnecting said input leg from said second power terminal in response to said first level output signal.

24. A buffer according to claim 23 wherein:

said first switchable current source means includes a third switch means for disconnecting one end of said input leg of said first current mirror means from said second power terminal and connecting it to said first power terminal in response to said second level input signal to deactivate said first current source means and turn off said first output transistor, and for connecting said one end of said input leg to said second power terminal in response to said first level input signal to activate said first current source means; and said second switchable current source means includes a fourth switch means for disconnecting one end of said input leg of said second current mirror means from said first power terminal and connecting it to said second power terminal in response to said first level input signal to deactivate said second current source means and turn of said second output transistor, and for connecting said one end of said input leg to said first power terminal in response to said second level input signal to activate said second current source means.

25. A buffer according to claim 14 wherein said first and second output transistors are insulated gate field effect transistors.

26. A buffer comprising:

buffer input and output;

an output insulated gate field effect transistor having its source and drain connected between said buffer output and a first power terminal and having a gate electrode, and control means connected to said buffer input and output and said gate electrode for biasing said gate electrode to operate said output transistor in a constant current mode for a substantial portion of an output signal on said buffer output transition from a first output level to a second output level in response to an input signal transition from a first to a second input level on said buffer input and to operate said output transistor in a constant voltage mode to drive said output to said second output level in response to said output signal reaching a third output level which substantially approaches said second output level.

27. A buffer according to claim 26, wherein said control means includes first means for biasing said gate at a first voltage to maintain said transistor in said constant current mode when activated by said control means and second means for biasing said gate at a second voltage substantially greater than said first voltage to maintain said transistor in said constant voltage mode when activated by said control means.

28. A buffer according to claim 27, wherein said first means dissipates power when activated and second means does not dissipate power when activated.

* * * * *